(12) United States Patent
Kwak et al.

(10) Patent No.: US 12,307,651 B2
(45) Date of Patent: May 20, 2025

(54) METHOD OF DETECTING MEASUREMENT ERROR OF SEM EQUIPMENT AND METHOD OF ALIGNING SEM EQUIPMENT

(71) Applicant: SAMSUNG ELECTRONICS CO., LTD., Suwon-si (KR)

(72) Inventors: Nohong Kwak, Seoul (KR); Donyun Kim, Seoul (KR); Yunhyoung Nam, Seoul (KR); Mincheol Kang, Hwaseong-si (KR); Kihyun Kim, Seongnam-si (KR)

(73) Assignees: SAMSUNG ELECTRONICS CO., LTD. (KR); SEOUL NATIONAL UNIVERSITY R&DB FOUNDATION (KR)

( * ) Notice: Subject to any disclaimer, the term of this patent is extended or adjusted under 35 U.S.C. 154(b) by 533 days.

(21) Appl. No.: 17/725,107

(22) Filed: Apr. 20, 2022

(65) Prior Publication Data
US 2023/0043003 A1   Feb. 9, 2023

(30) Foreign Application Priority Data
Aug. 4, 2021   (KR) ......................... 10-2021-0102668

(51) Int. Cl.
G06T 7/00   (2017.01)
G06T 7/30   (2017.01)
H01J 37/26   (2006.01)

(52) U.S. Cl.
CPC ............... *G06T 7/001* (2013.01); *G06T 7/30* (2017.01); *H01J 37/261* (2013.01);
(Continued)

(58) Field of Classification Search
CPC . G06T 7/001; G06T 7/30; G06T 2207/10061; G06T 2207/20081;
(Continued)

(56) References Cited

U.S. PATENT DOCUMENTS 7,615,746 B2   11/2009   Nagatomo et al.
8,809,778 B2   8/2014    Ogino et al.
(Continued)

FOREIGN PATENT DOCUMENTS

JP   4312910 B2 *   8/2009   ............. G01N 23/20
TW   490591 B  *    6/2002   ............ G06V 10/754

OTHER PUBLICATIONS

Morokuma, Hidetoshi, et al., "A new matching engine between design layout and SEM image of semiconductor device", Proc. of SPIE, Metrology, Inspection, and Process Control for Microlithography XIX, vol. 5752, May 10, 2005, 13 pp.

*Primary Examiner* — Pinalben Patel
(74) *Attorney, Agent, or Firm* — Myers Bigel, P.A.

(57) ABSTRACT

There are provided a method of accurately detecting a measurement error of SEM equipment by comparing and aligning a design image with an SEM image, and a method of accurately aligning SEM equipment based on a detected measurement error. The method of detecting a measurement error of SEM equipment includes acquiring SEM images of a measurement target, performing pre-processing on the SEM images and design images corresponding thereto, selecting training SEM images from among the SEM images, performing training by using the training SEM images and training design images and generating a conversion model between the SEM images and the design images, converting the SEM images into conversion design images by using the conversion model, extracting an alignment coordinate value by comparing and aligning the conversion design images with the design images, and determining a measurement error of the SEM equipment based on the alignment coordinate value.

18 Claims, 11 Drawing Sheets

(52) U.S. Cl.
CPC .............. *G06T 2207/10061* (2013.01); *G06T 2207/20081* (2013.01); *G06T 2207/20084* (2013.01); *G06T 2207/30148* (2013.01)

(58) Field of Classification Search
CPC . G06T 2207/20084; G06T 2207/30148; G06T 7/337; H01J 37/261; H01J 2237/221; H01J 37/28; G01N 23/2251; G01N 23/2206; G06N 3/08
See application file for complete search history.

(56) References Cited

U.S. PATENT DOCUMENTS

| | | | |
|---|---|---|---|
| RE45,224 E | | 10/2014 | Miyamoto et al. |
| 9,710,910 B2 | | 7/2017 | Kim et al. |
| 9,715,724 B2 | | 7/2017 | Schwarzband et al. |
| 10,529,534 B2 | | 1/2020 | Pathangi Sriraman |
| 10,545,490 B2 | * | 1/2020 | Dalla-Torre ..... G05B 19/41875 |
| 10,546,374 B2 | | 1/2020 | Onishi et al. |
| 2016/0350905 A1 | * | 12/2016 | Dalla-Torre ............ G06T 7/001 |
| 2020/0089838 A1 | * | 3/2020 | Nojima ................. G06F 30/398 |
| 2020/0143099 A1 | | 5/2020 | Wu et al. |

* cited by examiner

EXTRACTION OF ALIGNMENT
COORDINATE VALUE (Δx, Δy)

METHOD OF DETECTING MEASUREMENT ERROR OF SEM EQUIPMENT AND METHOD OF ALIGNING SEM EQUIPMENT

CROSS-REFERENCE TO RELATED APPLICATION

This application is based on and claims priority under 35 U.S.C. § 119 to Korean Patent Application No. 10-2021-0102668, filed on Aug. 4, 2021, in the Korean Intellectual Property Office, the disclosure of which is incorporated by reference herein in its entirety.

BACKGROUND

The inventive concept relates to errors in scanning electron microscopy (SEM) equipment, and more particularly, to a method of aligning SEM equipment having a measurement error.

A technique for photographing a device or a wiring pattern, formed on a semiconductor substrate such as a wafer, with SEM equipment and inspecting a difference from an initial design image by using an SEM image acquired through the photographing is known. However, the existing inspection methods may measure similarity between images or may find, compare, and align the same features, and may have a limitation that the shape or vector component between the images has to be similar. Accordingly, in the case of a method of inspecting heterogeneous images, inspection often fails because comparison and alignment are difficult. When the inspection fails, a person has to directly perform comparison and alignment, and this process may be time-consuming and expensive.

SUMMARY

The inventive concept provides a method of accurately detecting a measurement error of scanning electron microscopy (SEM) equipment by accurately comparing and aligning a design image with an SEM image, and a method of accurately aligning the SEM equipment based on the detected measurement error.

In addition, the technical goals to be achieved by the inventive concept are not limited to the technical goals mentioned above, and other technical goals may be clearly understood by one of ordinary skill in the art from the following descriptions.

According to some embodiments of the inventive concept, there is provided a method of detecting a measurement error of Scanning Electron Microscopy (SEM) equipment, the method including acquiring SEM images of a measurement target on a semiconductor substrate using the SEM equipment, performing pre-processing on the SEM images and design images corresponding thereto, selecting training SEM images from among the SEM images, performing training by using the training SEM images and training design images corresponding thereto to generate a conversion model between the SEM images and the design images, converting the SEM images into conversion design images using the conversion model, extracting an alignment coordinate value by comparing and aligning the conversion design images with the design images corresponding thereto, and determining a measurement error of the SEM equipment based on the alignment coordinate value.

According to some embodiments of the inventive concept, there is provided a method of aligning SEM equipment, the method including acquiring SEM images of a measurement target including a device or wiring pattern on a semiconductor substrate by using the SEM equipment, performing pre-processing on the SEM images and design images corresponding thereto, selecting training SEM images from among the SEM images, performing training by using the training SEM images and training design images corresponding thereto to generate a conversion model between the SEM images and the design images, converting the SEM images into conversion design images by using the conversion model, extracting an alignment coordinate value by comparing and aligning the conversion design images with the design images corresponding thereto, determining a measurement error of the SEM equipment based on the alignment coordinate value, and responsive to determining that the measurement error in the SEM equipment, transmitting the alignment coordinate value to the SEM equipment and aligning measurement coordinates of the SEM equipment.

According to some embodiments of the inventive concept, there is provided a method of aligning SEM equipment, the method including acquiring, by a SEM measurement apparatus, SEM images of a measurement target on a semiconductor substrate using the SEM equipment, performing, by a pre-processor circuit, pre-processing on the SEM images and design images corresponding thereto, selecting training SEM images from among the SEM images, performing training by using the training SEM images and training design images corresponding thereto to generate a conversion model between the SEM images and the design images, converting the SEM images into conversion design images by using the conversion model, extracting an alignment coordinate value by comparing and aligning the conversion design images with the design images corresponding thereto, and transmitting the alignment coordinate value to the SEM equipment and aligning measurement coordinates of the SEM equipment.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
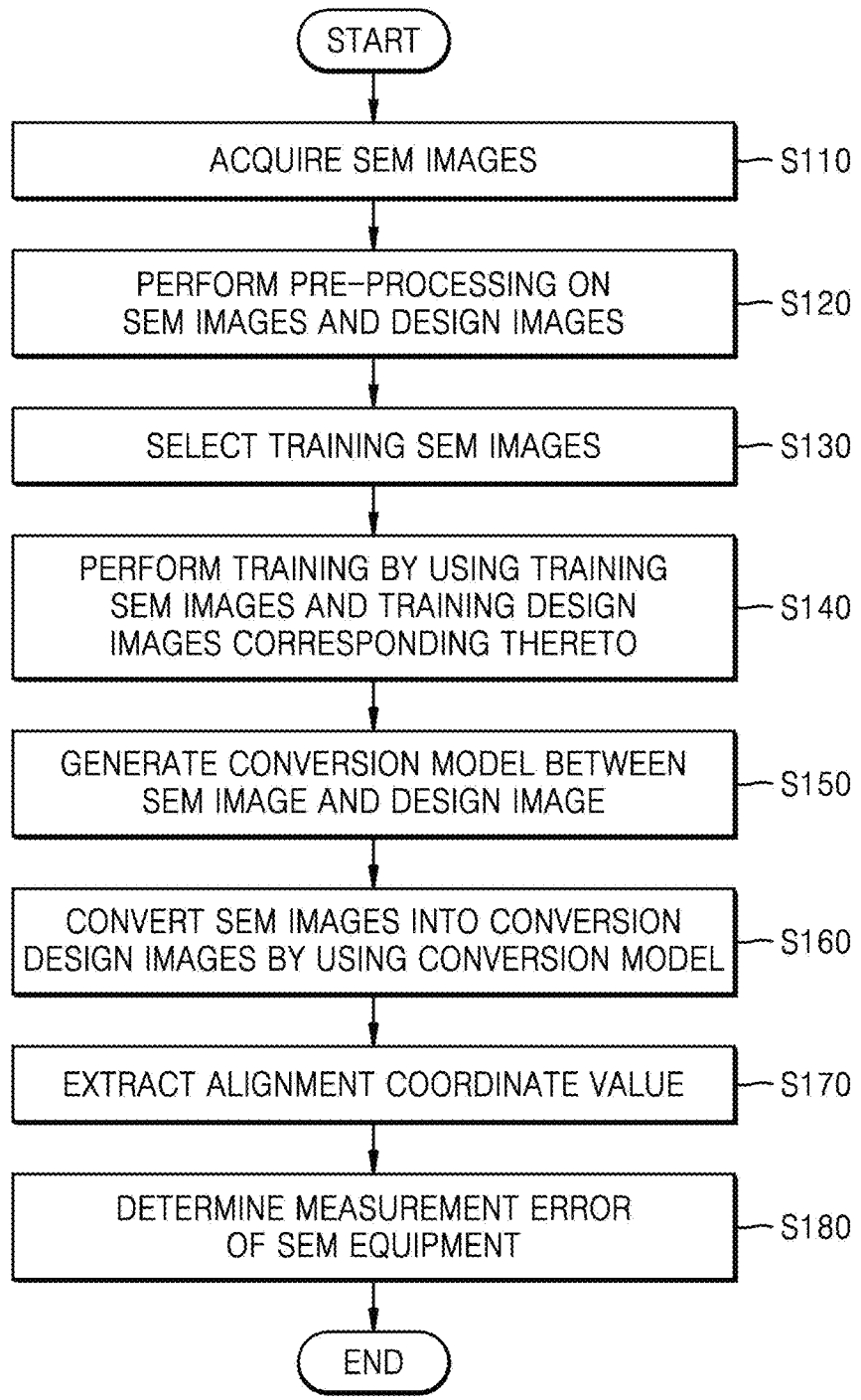
FIG. 1 is a schematic flowchart of a method of detecting a measurement error of scanning electron microscopy (SEM) equipment, according to some embodiments of the inventive concept.

Hereinafter, embodiments of the inventive concept will be described in detail with reference to the accompanying drawings. The same reference numerals are used for the same components in the drawings, and duplicate descriptions thereof are omitted.

FIG. 1 is a schematic flowchart of a method of detecting a measurement error of scanning electron microscopy (SEM) equipment, according to some embodiments of the inventive concept.

Referring to FIG. 1, the method of detecting a measurement error of SEM equipment (hereinafter, simply referred to as a 'measurement error detection method'), according to the present embodiment includes acquiring SEM images of a device or wiring pattern formed on a semiconductor substrate such as a wafer (Operation S110). The SEM images may be acquired through an SEM measuring apparatus (refer to an SEM measuring apparatus 110 in FIG. 10A). For reference, the SEM measuring apparatus focuses electrons, emitted from an electron gun, using lenses to make an electron beam, scans the electron beam on a sample to be inspected using a scanning coil, and acquires an image of the sample by detecting secondary electrons (SEs), and back scattered electrons (BSEs), etc. emitted from the sample. Unlike an optical lens, each of the lenses is a magnetic lens including an electromagnet (i.e., electromagnetic lens). In the SEM measuring apparatus, the resolution thereof is better as the diameter of the electron beam decreases, the image of the sample may be observed at a magnification up to hundreds of thousands of times, and a stereoscopic image of the sample may also be obtained. The SEM measuring apparatus (i.e., the SEM measuring apparatus 110) is described in more detail below with reference to FIG. 10A.

An SEM image may have a bitmap file format. For example, the SEM image may have a bitmap file format such as BitMaP (BMP), Tagged Image File Format (TIFF), or Joint Photographic Experts Group (JPEG). For reference, an image file may be generally divided into a bitmap file format and a vector file format. The bitmap file format refers to a scheme of composing an image with pixels, which are rectangular elements. Because a different color may be expressed for each pixel, a shading or a fine level of color throughout the image may be expressed, and the expression of color may be rich. In addition, color change, image correction, and compositing work are easy. However, because the number of pixels in one image is fixed, when the image is resized or compressed, original pixels of the image may be lost, and when the image is enlarged or reduced excessively, or continuously compressed and saved, the quality of the image may deteriorate.

On the other hand, the vector file format refers to a scheme of composing an image by using the value of a line segment connecting a point to a point, that is, refers to a scheme of expressing accurate lines and surfaces based on the coordinate values and curve values of points, lines, and surfaces by x and y coordinates by using mathematical calculations. Because an image is reconstructed by mathematical calculations without using pixels, the quality of the image is not significantly reduced, the original quality of the image is maintained without damage to the image even though the image is enlarged greatly, and image size adjustment and curve transformation are free, and transformation operation such as morphing and animation operations are easy. However, it may be difficult to express fine pictures or gradual color changes, processing speed may be slow when an effect is applied to an image, and natural synthesis with other images may be difficult.

A device or wiring pattern on a semiconductor substrate may be formed through a photolithography process based on a design image such as a computer-aided design (CAD) image. The CAD image may have, for example, a Graphic Data System (GDS) or GDSII file format. The GDS file format is a standard database file format for data exchange of an integrated circuit (IC) or IC-layout artwork, and belongs to a binary file format. The GDS file format may include various information about the layouts of planar geometric shapes, text labels, and hierarchical forms.

After the SEM images are acquired, pre-processing is performed on the SEM images and design images corresponding thereto (Operation S120). The pre-processing may refer to, for example, a process of generating a measurement information file for the SEM images and converting the design images into a bitmap file format. The measurement information file may include information such as measurement coordinates, Field Of View (FOV), pixel size, and rotation. As described above, the design images may have a GDS file format, and the GDS file format may be changed to an image file format, for example, a Portable Network Graphics (PNG) file format, through pre-processing. This pre-processing may facilitate the comparison and alignment of the SEM images with the design images later.

After the pre-processing, training SEM images are selected (Operation S130). The training SEM images may be previously selected from among the SEM images. For example, there may be thousands or tens of thousands of SEM images, and tens or hundreds of SEM images may be selected as the training SEM images. In order to increase the accuracy of a conversion model generated through training, SEM images in which a pattern and a space are clearly distinguished from each other may be selected as the training SEM images.

After selection of the training SEM images, training is performed using the training SEM images and training design images corresponding thereto (Operation S140). The training may be performed to find an optimal conversion model between the training SEM images and the training design images corresponding thereto. In other words, when an A training SEM image corresponds to a B training design image, the training may be understood as a process of finding a conversion model for converting the A training SEM image into a B' image that is almost identical to the B training design image. The training may be performed using an artificial intelligence (AI) learning algorithm, for example, a Generative Adversarial Network (GAN) algorithm. Training through the GAN algorithm is described in more detail below with reference to FIG. 3.

Then, as a result of the training, a conversion model is generated between an SEM image and a design image (Operation S150). The conversion model may correspond to a type of image conversion program that converts an α image into a β image, or an image conversion algorithm. As described above, converting an SEM image through the conversion model may generate an image that is almost identical to a design image corresponding to the SEM image. Hereinafter, an image converted from an SEM image through the conversion model is referred to as a 'conversion design image'.

After the conversion model is generated, the SEM images are converted into conversion design images by using the conversion model (Operation S160). In other words, conversion design images are generated by converting SEM images, which were not previously used for training, through the conversion model.

After the conversion design images are generated, the conversion design images are compared and aligned with design images corresponding thereto to extract an alignment coordinate value (Operation S170). The alignment coordinate value may correspond to a criterion indicating the degree of deviation between the conversion design images and the design images corresponding thereto. For reference, each of the conversion design images may be an image of a pattern at the same position as an SEM image corresponding thereto on the semiconductor substrate. Accordingly, the conversion design image and the SEM image corresponding thereto may have the same coordinate values. Based on correspondence between the design image and the conversion design image, when there is no error in the SEM equipment, the conversion design image has to exactly match the design image. However, when there is an error in measurement coordinates of the SEM equipment, it may not be possible to measure a pattern at a correct position on the semiconductor substrate during an SEM image acquisition process. Accordingly, an acquired SEM image may correspond to an SEM image of a position deviated from an original intended position, and the conversion design image may also be a conversion design image for a deviated position. As a result, the conversion design image does not match the design image and is misaligned with the design image. Therefore, it is necessary to align and match the conversion design image to the design image, and the alignment coordinate value may be extracted through such an alignment process. A process of extracting the alignment coordinate value is described in more detail below with reference to FIGS. 4A to 4C.

After the alignment coordinate value is extracted, a measurement error of the SEM equipment is determined based on the alignment coordinate value (Operation S180). For example, when the alignment coordinate value exceeds a set allowable value, it may be determined that there is a measurement error in the SEM equipment, and when the alignment coordinate value is less than or equal to the allowable value, the SEM equipment may be determined to be normal. When there is a measurement error in the SEM equipment, a process of aligning the SEM equipment may be performed thereafter. The alignment process for the SEM equipment is described in more detail below with reference to FIGS. 6 to 9.

In the measurement error detection method according to the present embodiment, the conversion model may be generated by using an AI learning algorithm, for example, a GAN algorithm, and the SEM image may be converted into a conversion design image through the conversion model. In addition, by comparing and aligning the conversion design image with the design image, the alignment coordinate value may be extracted automatically, quickly, and accurately. As a result, the measurement error detection method according to the present embodiment may quickly and accurately detect a measurement error of the SEM equipment based on the alignment coordinate value.

For reference, in the case of an existing method, in order to detect a measurement error of SEM equipment, a boundary image is derived through image processing on an SEM image, and an optimal distance is calculated by calculating a relative distance from a CAD image, which is the design image, by using the boundary image. However, in the case of the existing method, i) when the boundary of a pattern is not clear, ii) when a space between a pattern and a pattern in repeating patterns and the shape of the pattern itself are similar to each other, and/or iii) when the ends of a thin pattern are adjacent to each other, there is a limit in that a measurement error of the SEM equipment may not be accurately detected. In contrast, in the measurement error detection method according to the present embodiment, an alignment coordinate value may be quickly and accurately extracted through a conversion model generated based on an AI learning algorithm, thereby quickly and accurately detecting a measurement error of the SEM equipment.

Figure 2:
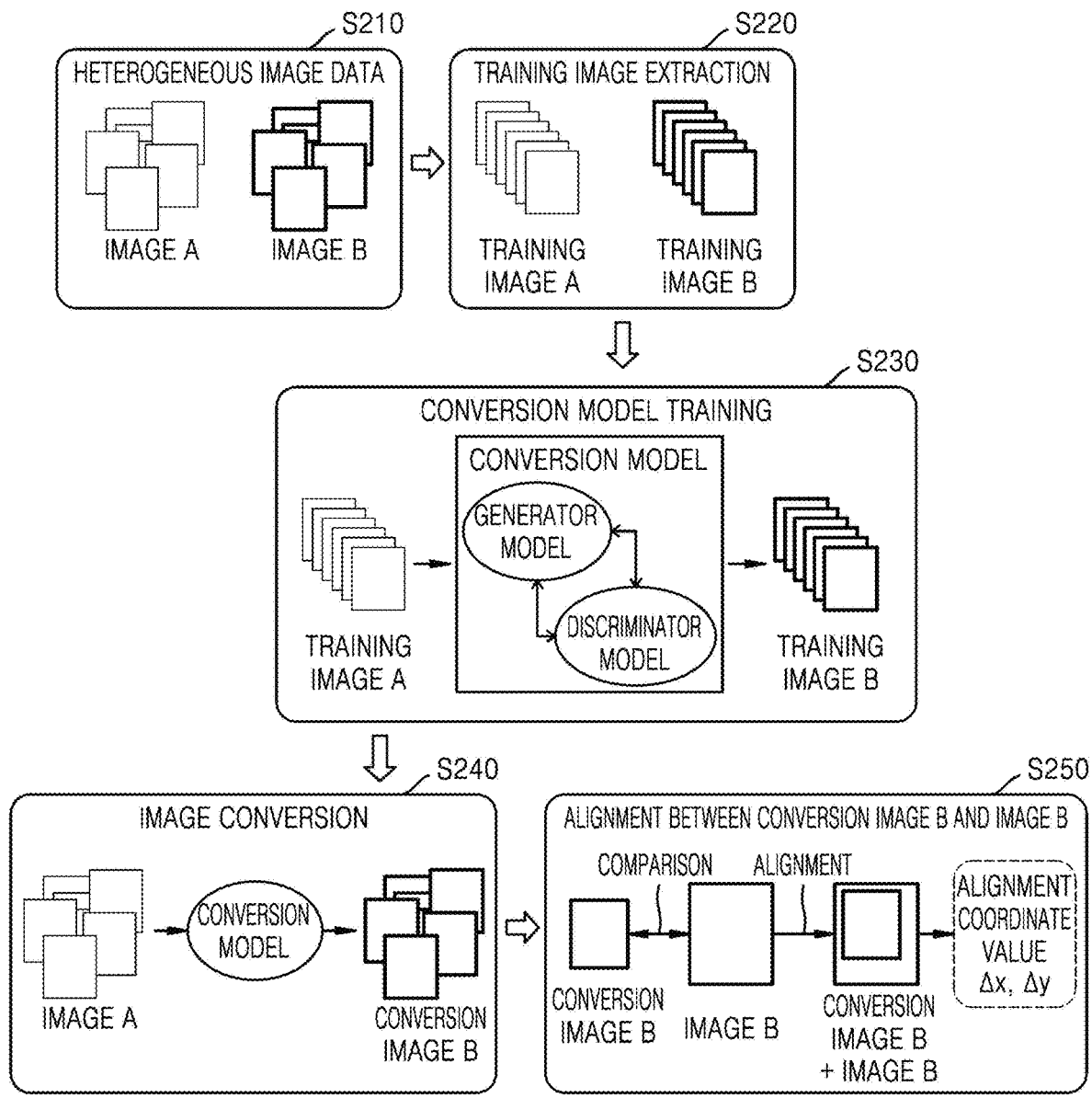
FIG. 2 is a conceptual diagram illustrating the measurement error detection method of FIG. 1.

FIG. 2 is a conceptual diagram illustrating the measurement error detection method of FIG. 1. Descriptions already given with reference to FIG. 1 are briefly given or omitted.

Referring to FIG. 2, in the measurement error detection method according to the present embodiment, heterogeneous image data is first acquired (Operation S210). Operation S210 may correspond to Operation S110 of acquiring SEM images and Operation S120 of performing pre-processing in FIG. 1. For example, in FIG. 2, 'image A' may correspond to SEM images and 'image B' may correspond to design images. The SEM images and the design images may be heterogeneous image data having different file formats. For example, the SEM images may have a BMP file format, and the design images may have a GDS file format. The 'image A' and the 'image B' may be images that have been pre-processed. Accordingly, the 'image B' may have a file format changed from a GDS file format to an image file format, for example, a PNG file format.

Then, training data is extracted (Operation S220). Operation S220 may correspond to Operation S130 of selecting training SEM images in FIG. 1. For example, in FIG. 2, 'training image A' may correspond to training SEM images selected from a plurality of SEM images. In Operation 220, 'training image B' is also extracted. The 'training image B' may correspond to training design images selected from a plurality of design images, and/or the training design images may correspond to the training SEM images. A training design image corresponding to each of the training SEM images may be selected.

Next, training for generating a conversion model is performed (Operation S230). Operation S230 may correspond to Operation S140 of performing training and Operation S150 of generating a conversion model in FIG. 1. The training may be performed using the GAN algorithm, which is an AI learning algorithm. The GAN algorithm is an adversarial generative neural network algorithm including a generator model and a discriminator model. A detailed operation of the GAN algorithm is described below with reference to FIG. 3. A conversion model may be generated through training based on the GAN algorithm.

Then, the 'image A' is converted into a 'conversion image B' by using the conversion model (Operation S240). Operation S240 may correspond to Operation S160 of converting SEM images into conversion design images in FIG. 1. The 'image A' may correspond to SEM images. In addition, the 'conversion image B' may be images obtained by converting SEM images through the conversion model, and may have a file format that is the same as or similar to that of the 'image B'. Also, the 'conversion image B' may have a shape corresponding to design images corresponding to the SEM images, that is, to the 'image B'. However, as described above, when there is a measurement error in the SEM equipment, the 'conversion image B' and the 'image B' may not exactly match each other in position.

Next, the 'conversion image B' is compared and aligned with the 'image B' (Operation S250). Operation S250 may correspond to Operation S170 of extracting an alignment coordinate value in FIG. 1. In this case, the comparison may correspond to a process of extracting a corresponding 'image B' by comparing a certain 'conversion image B' with a plurality of 'images B'. In addition, the alignment may correspond to a process of moving the 'conversion image B' so that the 'conversion image B' matches the 'image B'. For example, the alignment may refer to a process of moving the 'conversion image B' by x displacement ($\Delta x$) on an x-axis and by y displacement ($\Delta y$) on a y-axis so that the 'conversion image B' matches the 'image B'. In this alignment process, the x displacement ($\Delta x$) and the y displacement ($\Delta y$), which are distances moved by the 'conversion image B', may correspond to the alignment coordinate value. Then, a measurement error of the SEM equipment may be determined by comparing the alignment coordinate value with an allowable value.

In operation S250 of comparing and aligning the 'conversion image B' with the 'image B' in FIG. 2, the 'conversion image B' is shown to be smaller than the 'image B'. This may be because an SEM image having a size smaller than that of the design image is generally acquired and a conversion design image corresponding to the SEM image, that is, the 'conversion image B', is generated. Accordingly, a plurality of 'conversion images B' may be generated corresponding to one design image, that is, the 'image B'. Also, the 'image B' may include patterns corresponding to a plurality of 'conversion images B' at different positions. However, position information of the 'conversion image B' in the 'image B' may be different from the position of an actually generated 'conversion image B' due to the measurement error of the SEM equipment. According to some embodiments, one 'conversion image B' may be generated corresponding to one design image, that is, the 'image B'.

Figure 3:
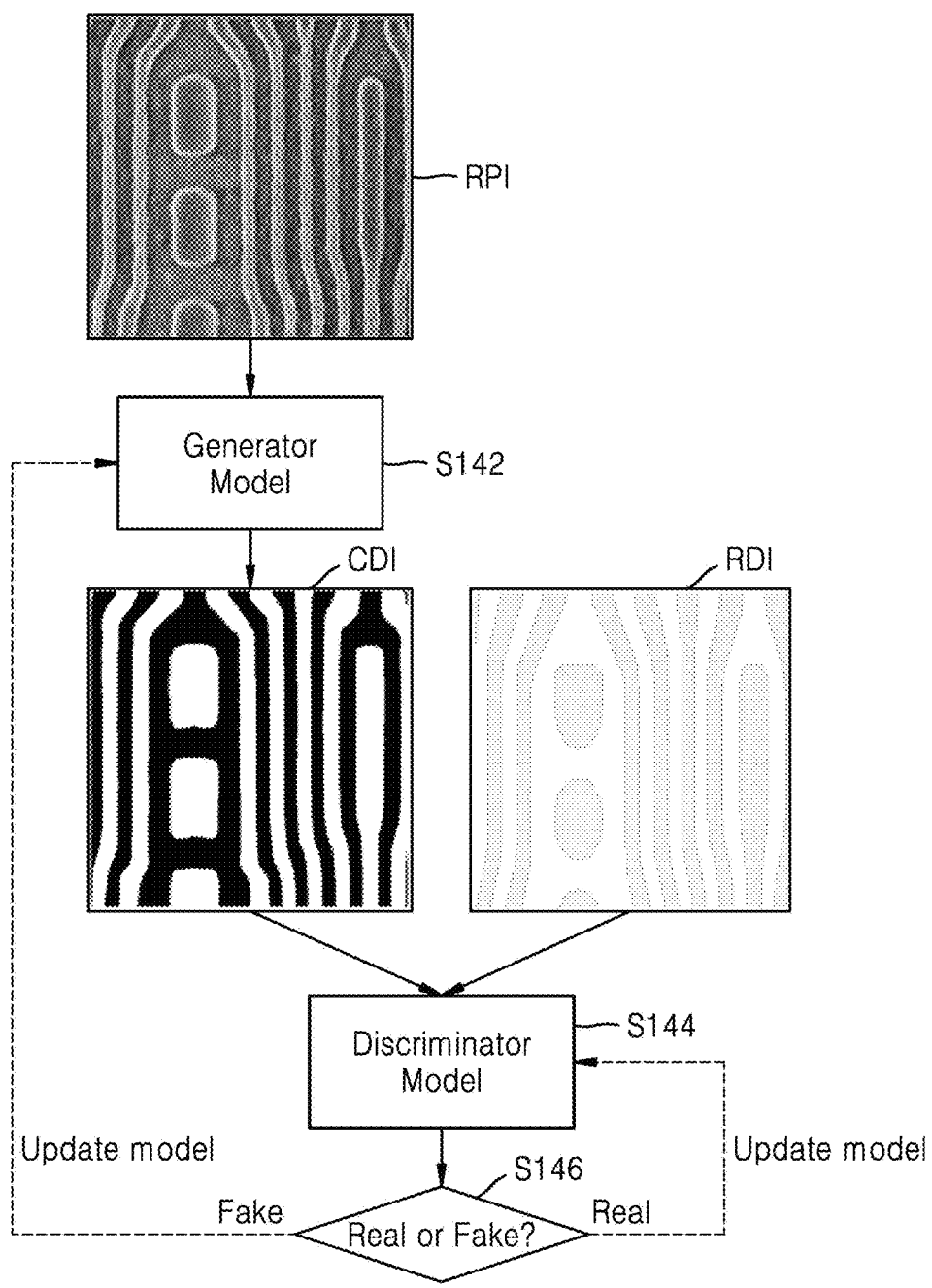
FIG. 3 is a conceptual diagram illustrating a process of generating a conversion model by using a Generative Adversarial Network (GAN) algorithm in an operation of generating a conversion model in the measurement error detection method of FIG. 1.

FIG. 3 is a conceptual diagram illustrating a process of generating a conversion model by using a GAN algorithm in an operation of generating a conversion model in the measurement error detection method of FIG. 1.

Referring to FIG. 3, the GAN algorithm is a generative algorithm based on deep learning, and may include two sub-models. That is, the GAN algorithm may include a generator model and a discriminator model. The generator model generates new examples, and the discriminator model determines whether the generated new examples are real data or fake data generated by the generator model.

For example, the generator model converts a real image into a conversion design image, and the discriminator model compares the conversion design image with real design image, and determines whether the conversion design image is a real design image or a fake design image generated by the generator model. Specifically, in FIG. 3, when a real pattern image RPI on a semiconductor substrate is input to the generator model, the generator model generates a conversion design image CDI (Operation S142). In addition, when the conversion design image CDI and an real design image RDI are input to the discriminator model, the discriminator model determines whether the conversion design image CDI is the same as the real design image RDI, that is, the conversion design image CDI is the real design image RDI or a design image (i.e., a fake design image) that is different from the real design image RDI (Operation S144). Then, according to a determination result, the generator model and the discriminator model are continuously updated (Operation S146). By repeating this process over and over again, when the discriminator model reaches a level at which the discriminator model may no longer distinguish between the conversion design image CDI and the real design image RDI, the training ends, and a generator model at this time is adopted as a final generative model or conversion model. The discriminator model is discarded when training is finished.

To better understand the operation of the GAN algorithm, an analogy will be used where it is assumed that the generator model is similar to a counterfeiter and the discriminator model is similar to a police officer. The counterfeiter has to create fake money that is indistinguishable from real money, and the police officer has to distinguish between real money and fake money. Thus, the counterfeiter and the police officer will compete with each other, and from a game theory point of view, they are adversarial, with the effect of playing a zero-sum game. In other words, when the police officer successfully distinguishes between fake money and real money, the police officer does not need to update parameters for distinction. In contrast, the counterfeiter has to update many parameters for counterfeiting. Conversely, when the counterfeiter successfully creates fake money so that the police officer may not distinguish between fake money and real money, the counterfeiter does not need to update parameters for counterfeiting. On the other hand, the police officer has to update a lot of parameters for distinction. When this process is repeated over and over, the counterfeiting reaches a level at which the police officer may no longer distinguish between fake money and real money, and the counterfeiting method may become a final generative model or conversion model.

Figure 4A:
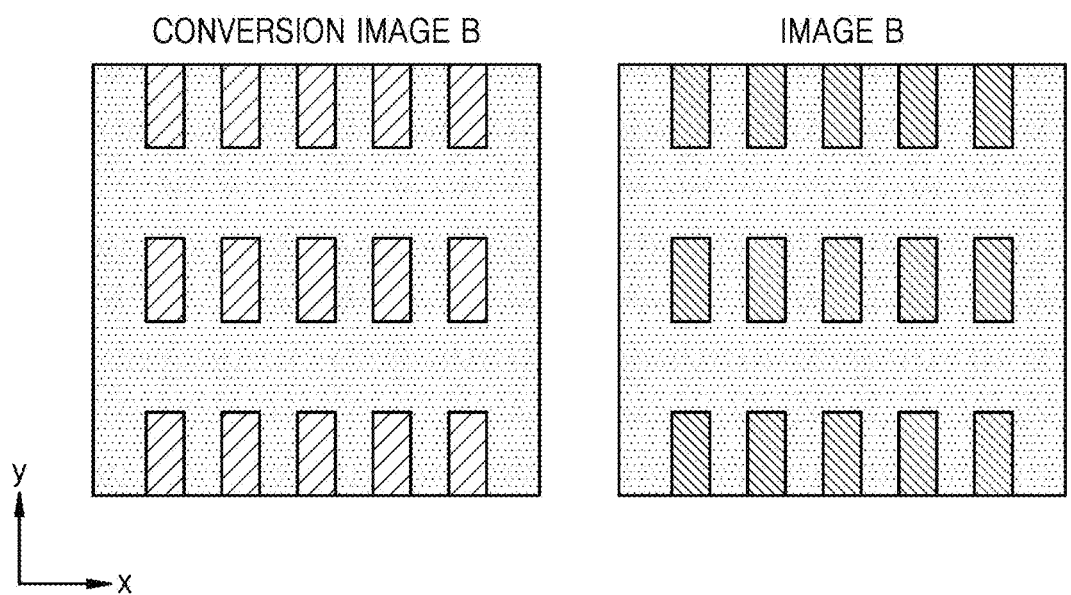
FIGS. 4A to 4C are conceptual diagrams specifically illustrating an operation of extracting alignment coordinate values in the measurement error detection method of FIG. 1.
Figure 4B:
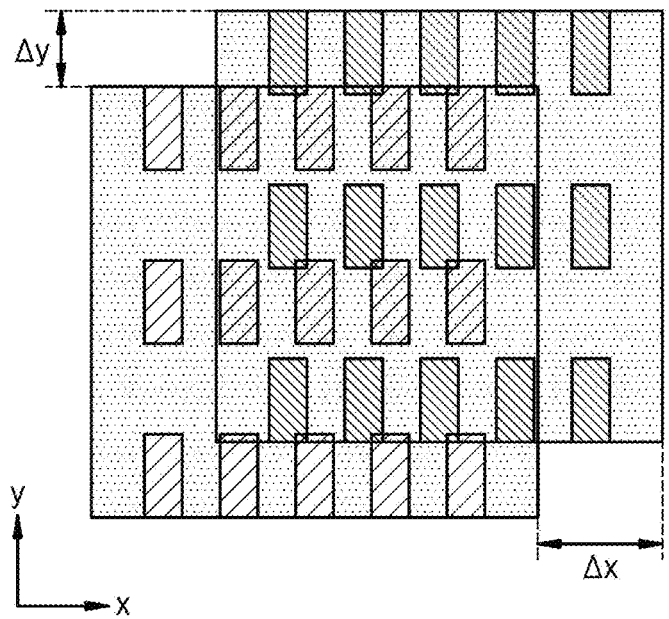
Figure 4C:
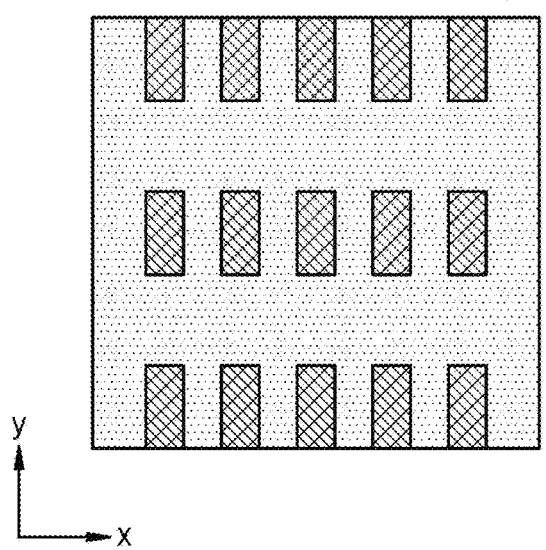

FIGS. 4A to 4C are conceptual diagrams specifically illustrating an operation of extracting alignment coordinate values in the measurement error detection method of FIG. 1.

Referring to FIG. 4A, a 'conversion image B' on the left thereof may correspond to a conversion design image corresponding to an SEM image, generated by a conversion model, and an 'image B' may correspond to a real design image corresponding to the SEM image. As described above, the 'image B' corresponding to the real design image may be larger than the 'conversion image B' generated by a conversion model. However, for convenience of explanation, the 'conversion image B' and the 'image B' are shown in substantially the same size.

As shown in FIG. 4A, the shape of the 'conversion image B' may be substantially the same as that of the 'image B'. However, due to a measurement error of the SEM equipment, the position of the 'conversion image B' and the position of the 'image B' may be different from each other.

Referring to FIG. 4B, it is shown that the position of the 'conversion image B' and the position of the 'image B' are different from each other. Specifically, the 'conversion image B' and the 'image B' may have a difference by an x-displacement ($\Delta x$) on the x-axis and a difference by a y-displacement ($\Delta y$) on the y-axis. Accordingly, to align the 'conversion image B' with the 'image B', the 'conversion image B' has to be moved to the right by the x-displacement ($\Delta x$) on the x-axis and moved upward by the y-displacement ($\Delta y$) on the y-axis.

FIG. 4C shows that the 'conversion image B' is moved to the right by the x-displacement ($\Delta x$) on the x-axis and moved upward by the y-displacement ($\Delta y$) on the y-axis to align the 'conversion image B' with the 'image B'. The aligning process may be performed not by a method of finding the x-displacement (Δx) and the y-displacement (Δy) and moving the 'conversion image B' as much as the found displacements, but by a method of finding displacements by which the 'conversion image B' is moved when the 'conversion image B' matches the 'image B, that is, when the 'conversion image B' is aligned with the 'image B, while moving the 'conversion image B'. This is because: there is a position error in an SEM image due to a measurement error of the SEM equipment, the 'conversion image B' is generated from the SEM image having the position error, and thus, the exact position coordinates of the 'conversion image B' may not be known. Whether the alignment is achieved may be found using Peak Signal-to-Noise Ratio (PSNR). For example, when the alignment is not achieved, a PSNR value may be low. In other words, a lot of noise may be included in the 'conversion image B' and the 'image B' before the alignment. However, when the alignment is achieved, the PSNR value is the highest. That is, noise may be minimized.

Figure 5:
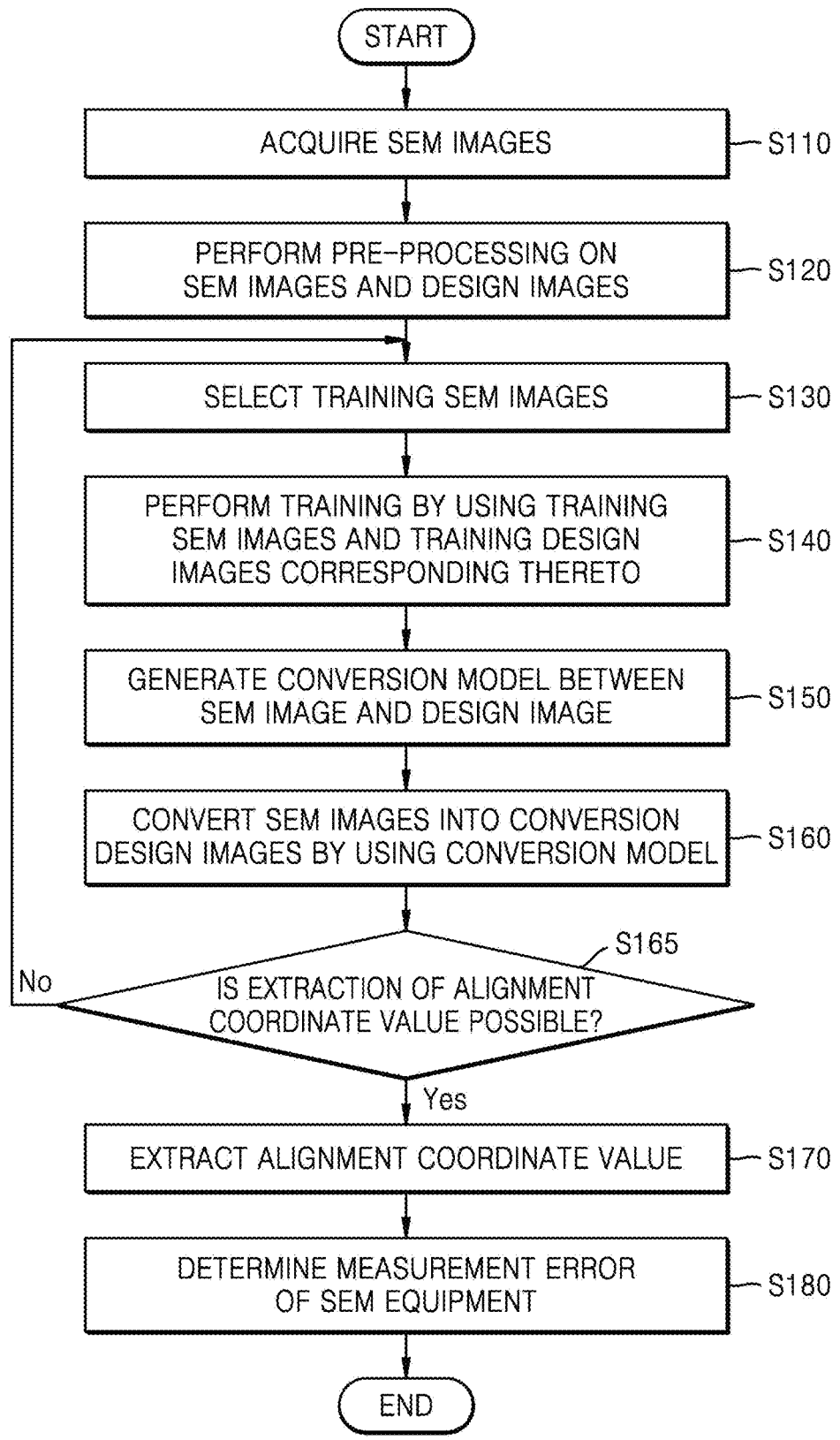
FIG. 5 is a schematic flowchart of a method of detecting a measurement error of SEM equipment, according to some embodiments of the inventive concept.

FIG. 5 is a schematic flowchart of a measurement error detection method according to some embodiments of the inventive concept. Descriptions already given with reference to FIGS. 1 to 4 are briefly given or omitted.

Referring to FIG. 5, the measurement error detection method according to the present embodiment may be different from the measurement error detection method of FIG. 1 in that the measurement error detection method according to the present embodiment further includes Operation S165 of determining whether the extraction of an alignment coordinate value is possible before Operation S170 of extracting an alignment coordinate value. Specifically, in the measurement error detection method according to the present embodiment, it is determined whether the extraction of an alignment coordinate value is possible (Operation S165) after Operation S160 of converting SEM images into conversion design images. In this case, the possibility of extraction of the alignment coordinate value may be determined by, for example, a set PSNR value. For example, when the set PSNR value is not reached by the movement of a conversion design image, it is determined that the extraction of the alignment coordinate value is not possible (No), and the process proceeds to Operation S130 of selecting training SEM images. When at least the set PSNR value is obtained by the movement of the conversion design image, it is determined that the extraction of the alignment coordinate value is possible (Yes), and the process proceeds to Operation S170 of extracting the alignment coordinate value.

For reference, when it is impossible to extract the alignment coordinate value, it may be due to the generation of an incomplete conversion model due to incorrect selection of training SEM images. For example, when the distinction between patterns and space is ambiguous, or when SEM images in which patterns are blurred are selected as training SEM images, an inaccurate conversion model may be generated during a training process. When the conversion model is inaccurate, a completely different 'conversion design image' may be generated, and accordingly, it may not be aligned with a corresponding real design image. Therefore, it is necessary to discard the existing conversion model, select a training SEM image again, and generate a new conversion model through a training process.

Figure 6:
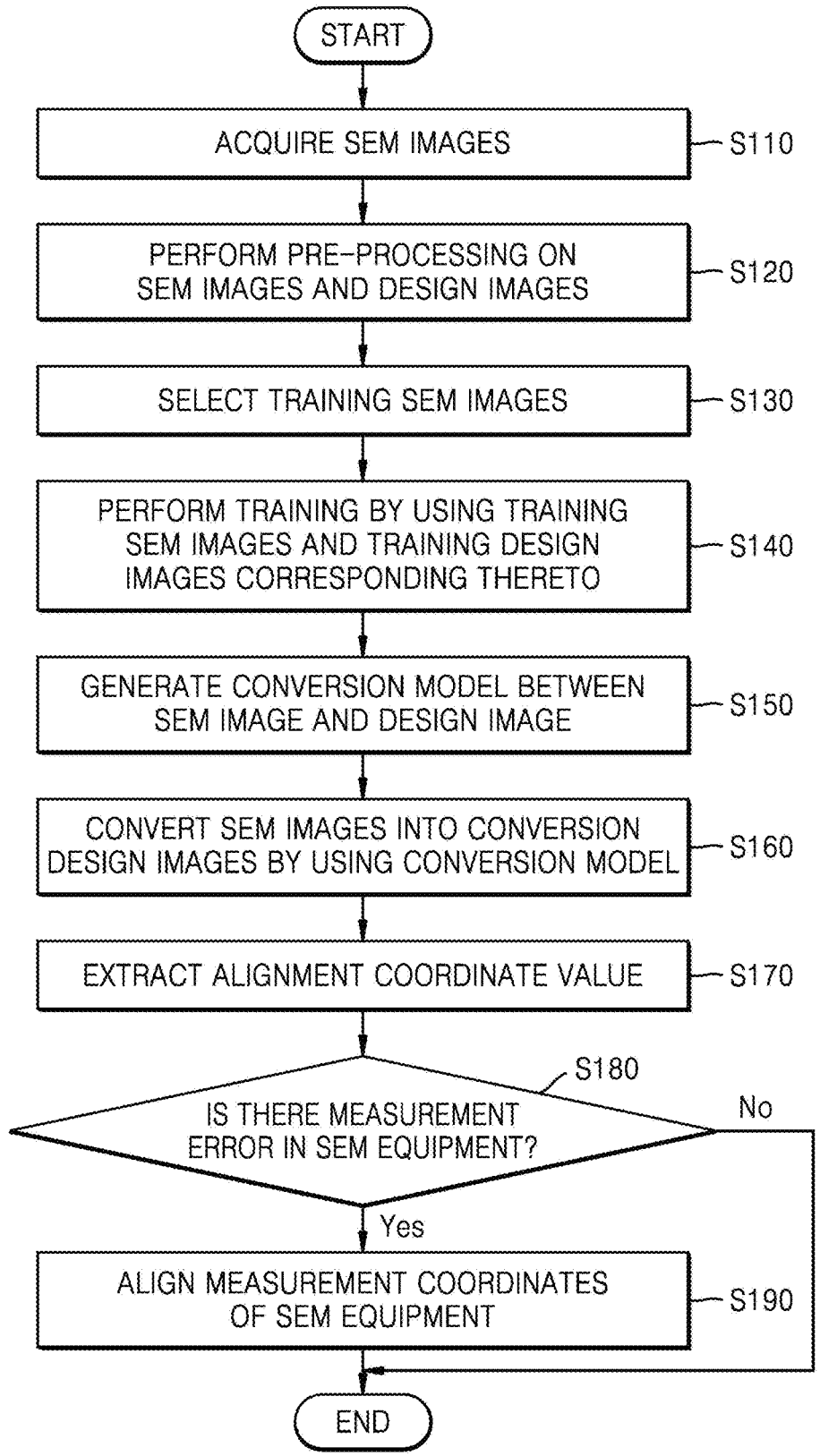
FIG. 6 is a schematic flowchart of a method of aligning SEM equipment, according to some embodiments of the inventive concept.

FIG. 6 is a schematic flowchart of a method of aligning SEM equipment, according to some embodiments of the inventive concept. Descriptions already given with reference to FIGS. 1 to 5 are briefly given or omitted.

Referring to FIG. 6, in the method of aligning SEM equipment, according to the present embodiment, Operation S110 of acquiring SEM images to Operation S170 of extracting an alignment coordinate value are sequentially performed. Operation S110 of acquiring SEM images to Operation S170 of extracting an alignment coordinate value are the same as those described with reference to FIG. 1.

Then, based on the alignment coordinate value, it is determined whether there is a measurement error in the SEM equipment (Operation S180). Operation S180 may be substantially the same as Operation S180 of determining a measurement error of SEM equipment in FIG. 1. However, in order to proceed to a next operation according to a determination result, the block of Operation S180 is indicated by a diamond in FIG. 6 to denote a decision block. In Operation S180, as described above, it is determined whether there is a measurement error in the SEM equipment, based on whether the alignment coordinate value exceeds a set allowable value.

If it is determined that there is a measurement error in the SEM equipment because the alignment coordinate value exceeds the set allowable value (Yes), the measurement coordinates of the SEM equipment are aligned (Operation S190). The alignment of the measurement coordinates of the SEM equipment may be performed based on previously obtained alignment coordinate values. For example, when the obtained alignment coordinate values are a first x-displacement (Δx1) and a first y-displacement (Δy1), the measurement coordinates of the SEM equipment are corrected to a position moved by the first x-displacement (Δx1) and the first y-displacement (Δy1). The SEM equipment may be aligned through the correction of the measurement coordinates of the SEM equipment. That is, through the alignment of the SEM equipment, an SEM image acquired by the SEM equipment may be accurately aligned with a design image corresponding to the SEM image.

Figure 7:
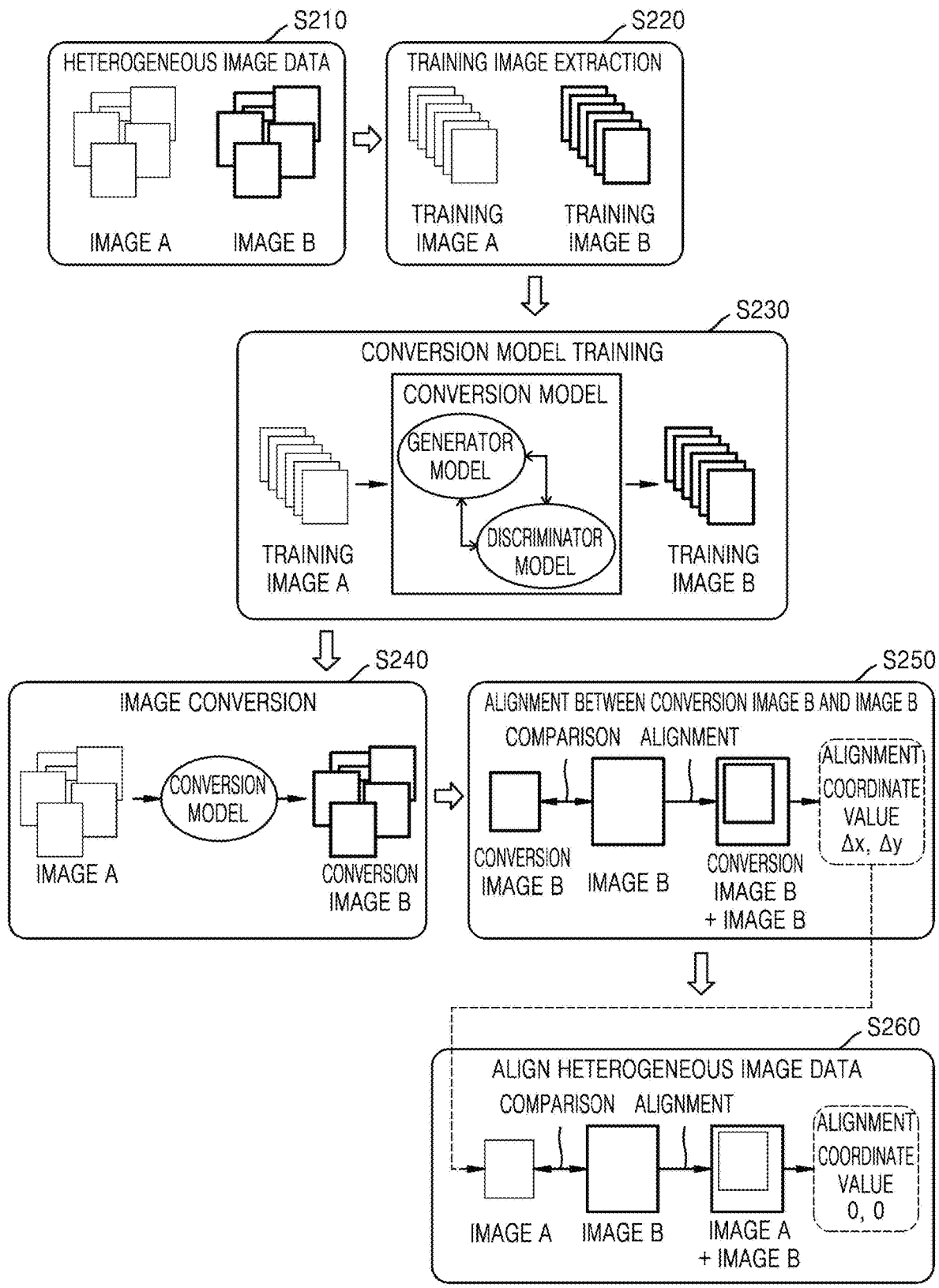
FIG. 7 is a conceptual diagram illustrating the method of aligning SEM equipment, shown in FIG. 6.

FIG. 7 is a conceptual diagram illustrating the method of aligning the SEM equipment, shown in FIG. 6.

Referring to FIG. 7, Operation S210 of acquiring heterogeneous image data to Operation S250 of aligning a conversion image B with an image B are sequentially performed. Operation S210 of acquiring heterogeneous image data to Operation S250 of aligning a conversion image B with an image B are the same as those described with reference to FIG. 2. As shown in FIG. 7, in Operation S250 of aligning the conversion image B with the image B, alignment coordinate values, for example, x-displacement (Δx) and y-displacement (Δy), may be extracted. Then, the alignment coordinate values are provided as feedback to the SEM equipment to align the measurement coordinates of the SEM equipment (Operation S260). FIG. 7 shows a comparison and alignment process between an image A, which is an SEM image, and an image B, which is a design image corresponding to the SEM image, in relation to the alignment of measurement coordinates of the SEM equipment. In this case, the image A may correspond to an SEM image acquired through the SEM equipment after the alignment of measurement coordinates of the SEM equipment is performed. In the comparison and alignment between the image A and the image B, the alignment coordinate values, that is, the x-displacement (Δx) and the y-displacement (Δy), are each 0, indicating that the SEM equipment is correctly aligned.

Figure 8:
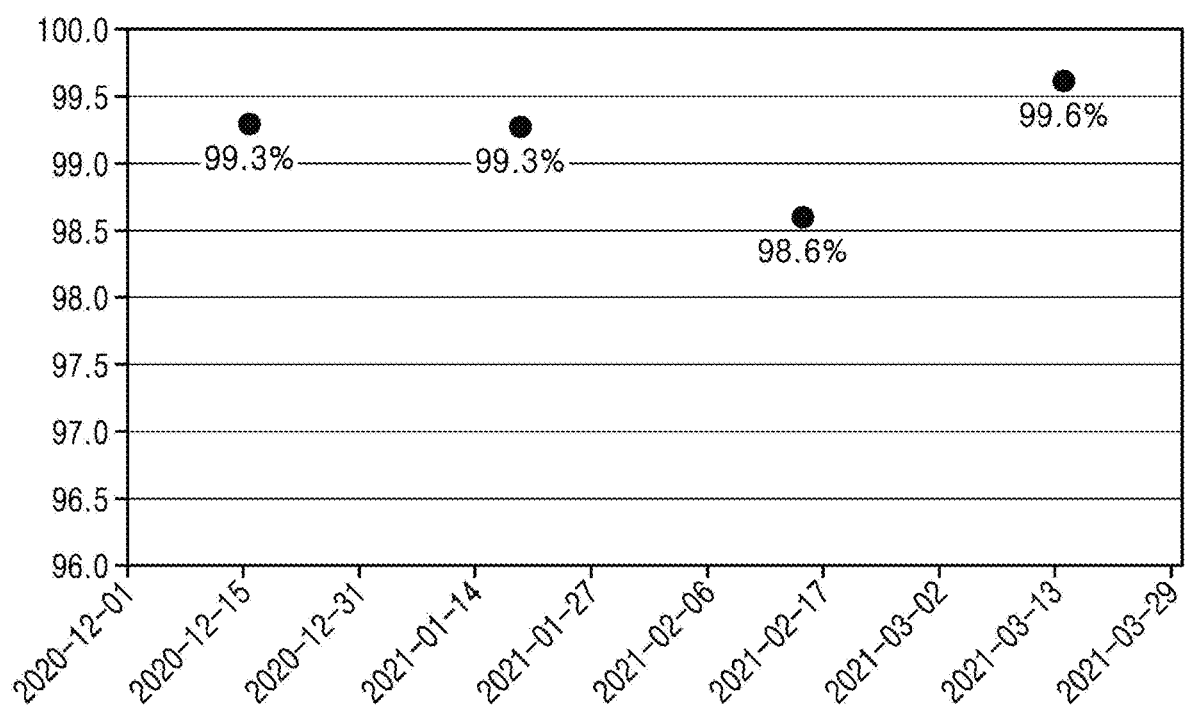
FIG. 8 is a graph showing an effect of the method of aligning SEM equipment, shown in FIG. 6.

FIG. 8 is a graph showing an effect of the method of aligning the SEM equipment, shown in FIG. 6. In the graph, the x-axis represents the date of measurement and the y-axis represents the alignment accuracy of an image, and the unit of the alignment accuracy is %.

Referring to FIG. 8, as may be seen from the graph, the alignment accuracy of the image, obtained by the method of aligning the SEM equipment, is almost 98% or more. For reference, in the case of the existing method, the alignment accuracy of an image is quite low, about 60% to 70%. In addition, the existing method includes a process in which a person directly reviews a measurement error, and thus, the alignment time may be very slow. For example, in the case of the existing method, measurement error determination and the alignment of SEM equipment are performed by detecting about 4000 points for 8 hours per person. However, in the case of the method of aligning SEM equipment, according to the present embodiment, because calculations are automatically performed through the Graphics Processing Unit (GPU) server, measurement error determination and the alignment of the SEM equipment may be performed by detecting about 80,000 points for 8 hours per GPU server. As a result, the method of aligning SEM equipment, according to the present embodiment, may perform the alignment of the SEM equipment 20 times or more faster than the existing method.

Specifically, in the method of aligning SEM equipment, according to the present embodiment, it may take about 10 minutes for an SEM server 130 (see FIG. 10A) of the SEM equipment to acquire data for SEM images, and it may take about 10 minutes for a calculation and alignment server 150 (see FIG. 10A) to pre-process the SEM images and design images corresponding thereto and select training SEM images. In addition, it may take about 20 minutes for the calculation and alignment server 150 to generate a conversion model through training, compare and align a conversion design image generated by the conversion model with a real design image, and extract an alignment coordinate value. In addition, it may take about 10 minutes to provide the extracted alignment coordinate value as feedback to the SEM server 130 and align the SEM equipment. Therefore, the SEM equipment may be aligned in about 50 minutes in total. When the alignment coordinate value is not extractable, it may be necessary to select new training SEM images again and generate a new conversion model through training. Therefore, when the alignment coordinate value is not extractable, it may further take about 10 minutes to select new training SEM images, and subsequently, processes of training and generating conversion models, generating a conversion design image, extracting an alignment coordinate value through comparison and alignment, and providing the extracted alignment coordinate value to the SEM server 130 as feedback may be performed again.

Figure 9:
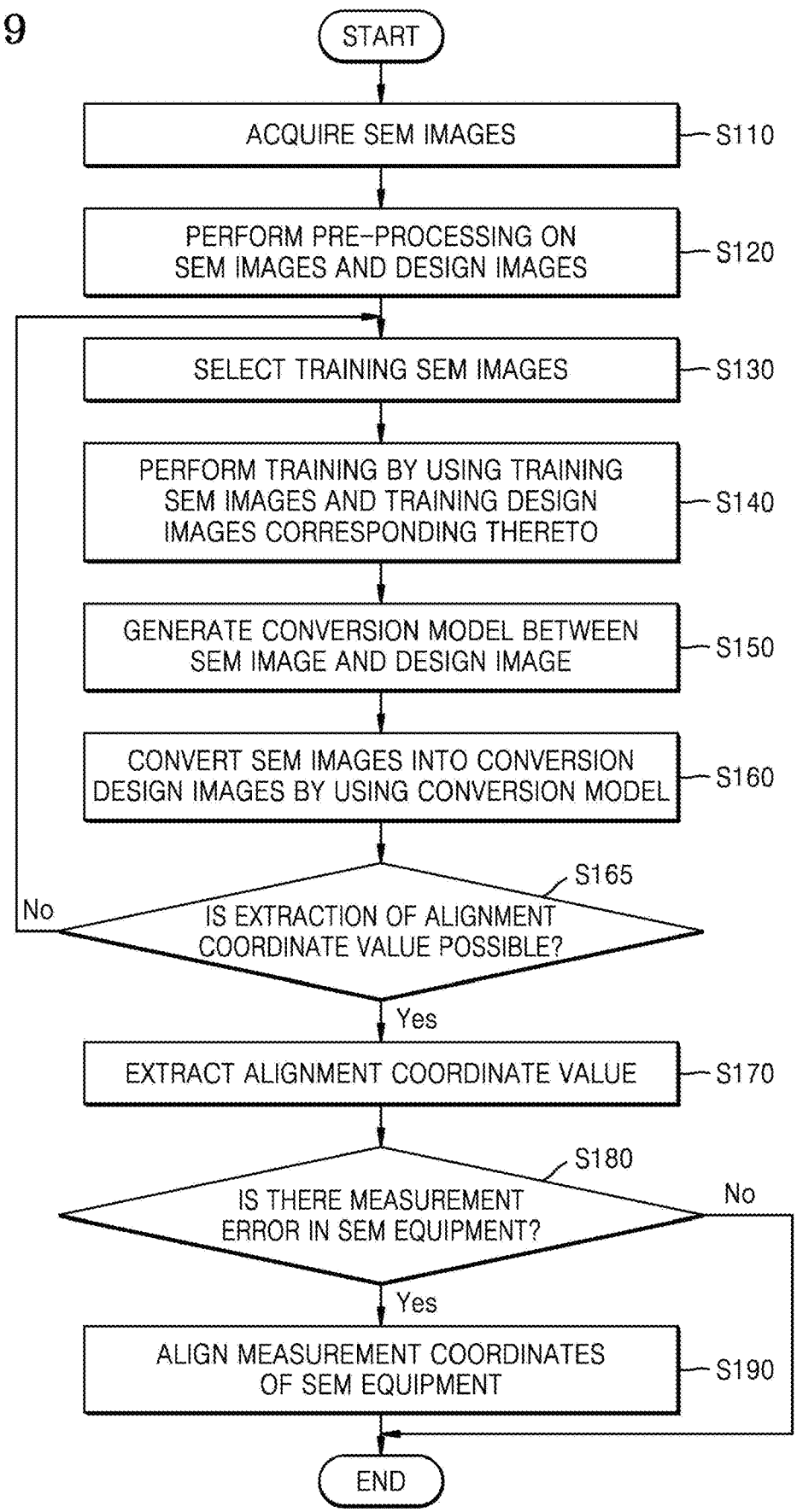
FIG. 9 is a schematic flowchart of a method of aligning SEM equipment, according to some embodiments of the inventive concept.

FIG. 9 is a schematic flowchart of a method of aligning SEM equipment, according to some embodiments of the inventive concept. Descriptions already given with reference to FIGS. 1 to 8 are briefly given or omitted.

Referring to FIG. 9, the method of aligning SEM equipment, according to the present embodiment, may be different from the method of aligning SEM equipment, shown in FIG. 6, in that the method according to the present embodiment further includes Operation S165 of determining whether the extraction of an alignment coordinate value is possible. Specifically, in the method of aligning SEM equipment, according to the present embodiment, it is determined whether the extraction of the alignment coordinate value is possible (Operation S165) after Operation S160 of converting SEM images into conversion design images. In this case, the possibility of extraction of the alignment coordinate value may be determined by, for example, a set PSNR value. Whether it is possible to extract the alignment coordinate value based on the PSNR value is the same as described in the measurement error detection method of FIG. 5.

When the extraction of the alignment coordinate value is possible (Yes), the process proceeds to Operation S170 of extracting the alignment coordinate value, and the alignment coordinate value is extracted. Subsequently, it is determined whether there is a measurement error in the SEM equipment, based on the alignment coordinate value (Operation S180), and based on a result of the determination, Operation S190 of aligning the measurement coordinates of the SEM equipment is performed, or the method of aligning the SEM equipment is terminated. When the extraction of the alignment coordinate value is no possible (No), the process proceeds to Operation S130 of selecting training SEM images, and subsequent operations are repeated.

Figure 10A:
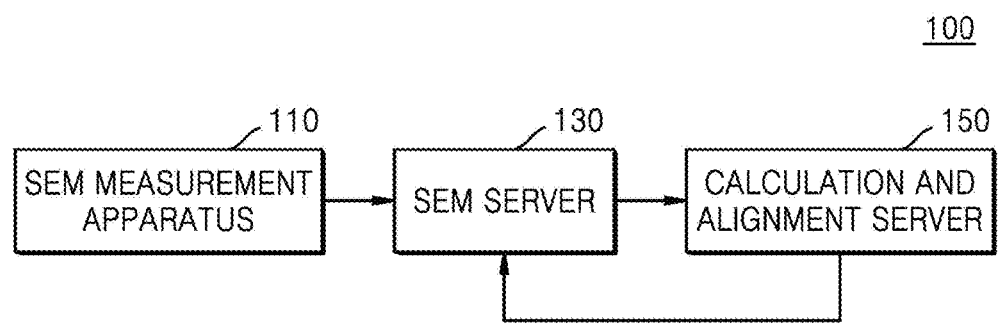
FIG. 10A is a block diagram of an alignment system of SEM equipment according to some embodiments of the inventive concept.
Figure 10B:
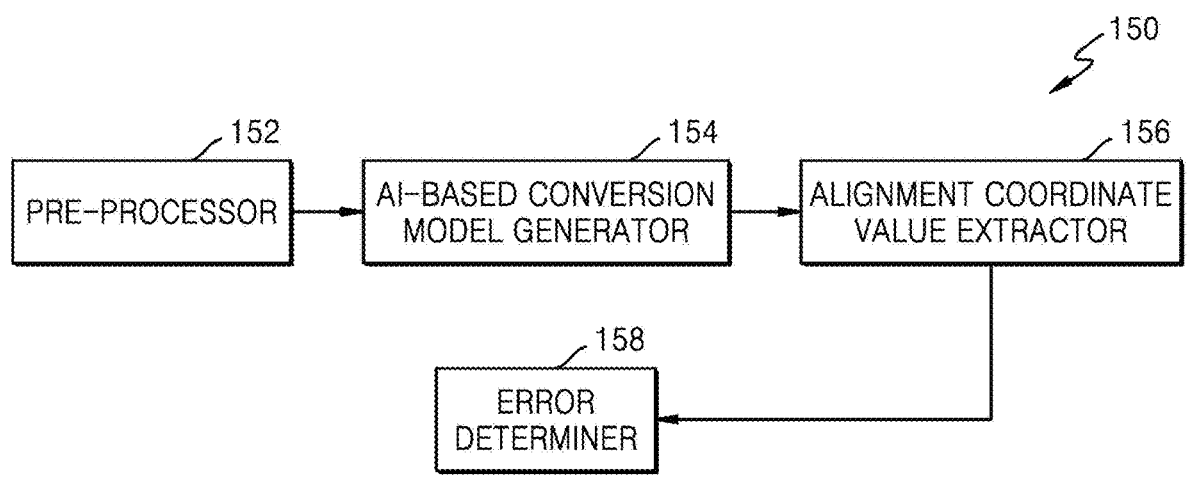
FIG. 10B is a block diagram of a calculation and alignment server in the alignment system of the SEM equipment of FIG. 10A.

FIG. 10A is a block diagram of an alignment system 100 of SEM equipment according to some embodiments of the inventive concept, and FIG. 10B is a block diagram of a calculation and alignment server 150 in the alignment system 100 of the SEM equipment of FIG. 10A. The alignment system 100 and the calculation and alignment server 150 are described with reference to FIG. 6 as well as FIGS. 10A and 10B, and descriptions already given with reference to FIGS. 1 to 9 are briefly given or omitted.

Referring to FIGS. 10A and 10B, the alignment system 100 of the SEM equipment according to the present embodiment may include an SEM measurement apparatus 110, an SEM server 130, and the calculation and alignment server 150. The SEM measurement apparatus 110 may refer to an apparatus for photographing a pattern on a semiconductor substrate as an SEM image.

More specifically, the SEM measurement apparatus 110 may include an electron gun, an anode, a magnetic lens, a scanning coil, a first detector, a second detector, a scanner, and a stage. The electron gun may be, for example, a Schottky-type or thermal field emission-type electron gun. An electron beam may be emitted by applying an accelerating voltage to the electron gun. The anode is an accelerating electrode, and the electron beam is accelerated by a voltage applied between the electron gun and the anode. The magnetic lens may focus and accelerate the electron beam. The scanning coil may scan the electron beam one-dimensionally or two-dimensionally on a semiconductor substrate to be measured, that is, a specimen. The first detector detects electrons backscattered from the semiconductor substrate by electron beam irradiation, and the second detector detects secondary electrons generated in the semiconductor substrate by electron beam irradiation. The scanner may analyze a detection signal for electrons detected by the first and second detectors to generate an image of a pattern on the semiconductor substrate, that is, an SEM image. The stage is an apparatus on which the semiconductor substrate is arranged, and the semiconductor substrate may be placed on the upper surface of the stage and supported by the stage, and may be moved together with the movement of the stage. The SEM server 130 generally controls the SEM measurement apparatus 110, and transmits an SEM image acquired by the SEM measurement apparatus 110 and data related to the SEM image measurement to the calculation and alignment server 150.

For example, the data related to the SEM image measurement may include data about measurement coordinates, FOV, pixel size, rotation, and the like. The SEM image acquired by the SEM measurement apparatus 110 may be acquired based on measurement coordinates stored in the SEM server 130. When there is an error in the measurement coordinates stored in the SEM server 130, a position error may occur in the SEM image acquired through the SEM measurement apparatus 110, and the SEM image may deviate from a design image corresponding thereto. Therefore, the SEM measurement apparatus 110 or the SEM equipment 100 has to be aligned so that the SEM measurement apparatus 110 may acquire an SEM image at correct measurement coordinates through the correction of the measurement coordinates stored in the SEM server 130. The calculation and alignment server 150 may perform operations such as pre-processing for SEM images and design images corresponding thereto, selection of training SEM images, training and conversion model generation using a GAN algorithm, conversion design image generation, and alignment coordinate value extraction through comparison and alignment.

After the extraction of the alignment coordinate value, the alignment coordinate value is provided to the SEM server 130 as feedback, and thus, the measurement coordinates stored in the SEM server 130 may be corrected. Referring to FIG. 10B, the calculation and alignment server 150 may include a pre-processor 152, an AI-based conversion model generator 154, and an alignment coordinate value extractor 156, and an error determiner 158.

The pre-processor 152 performs pre-processing on the SEM images and the design images corresponding thereto. The pre-processing of the SEM images may refer to, for example, generating a measurement information file. The pre-processing of the design images may refer to, for example, converting a file format. The AI-based conversion model generator 154 selects training SEM images and training real images corresponding thereto, and performs training by using a GAN algorithm. In addition, the AI-based conversion model generator 154 generates a conversion model as a result of the training. The alignment coordinate value extractor 156 converts the SEM images into conversion design images by using the conversion model. In addition, the alignment coordinate value extractor 156 compares and aligns the conversion design images with design images corresponding thereto and extracts an alignment coordinate value. The error determiner 158 compares the extracted alignment coordinate value with a set allowable value and determines whether there is a measurement error in the SEM equipment. In addition, when it is determined that there is a measurement error in the SEM equipment, the error determiner 158 provides the alignment coordinate value to the SEM server 130 as feedback. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s). For example, the SEM server 130, the pre-processor 152, the AI-based conversion model generator 154, the alignment coordinate value extractor 156, the error determiner 158 may be circuits implemented in hardware and/or software.

Accordingly, embodiments of the present disclosure may be embodied in hardware and/or in software (including firmware, resident software, micro-code, etc.) that runs on a processor such as a digital signal processor, which may collectively be referred to as "circuitry," "a module" or variants thereof.

While the inventive concept has been particularly shown and described with reference to embodiments thereof, it will be understood that various changes in form and details may be made therein without departing from the spirit and scope of the following claims.

What is claimed is:

1. A method of detecting a measurement error of Scanning Electron Microscopy (SEM) equipment, the method comprising:
acquiring SEM images of a measurement target on a semiconductor substrate using the SEM equipment;
performing pre-processing on the SEM images and design images of the device or wiring pattern of the semiconductor substrate corresponding thereto;
selecting training SEM images from among the SEM images;
performing training using the training SEM images and training design images corresponding thereto to generate a conversion model between the SEM images and the design images;
converting the SEM images into conversion design images using the conversion model;
extracting an alignment coordinate value by comparing and aligning the conversion design images with the design images corresponding thereto; and
determining the measurement error of the SEM equipment based on the alignment coordinate value,
wherein the conversion model is generated using a Generative Adversarial Network (GAN) algorithm that comprises a generator model and a discriminator model,
wherein the generator model generates initial conversion design images for the training SEM images, and
wherein the discriminator model compares the initial conversion design images with corresponding ones of the design images and determines whether the initial conversion design images are fake.

2. The method of claim 1,
wherein the generator model and the discriminator model each include feedback that is complementary to each other and subsequently generate the conversion model.

3. The method of claim 1, wherein extracting the alignment coordinate value comprises:
matching corresponding parts of the design images by moving the conversion design images along an x-axis and/or along a y-axis,
wherein the alignment coordinate value is represented by $\Delta x$ and $\Delta y$, corresponding to respective distances along the x-axis and along the y-axis that the conversion design images have moved.

4. The method of claim 3, wherein the alignment coordinate value is determined using Peak Signal-to-Noise Ratios (PSNRs) of the conversion design images and the design images.

5. The method of claim 1, wherein performing the pre-processing comprises:
generating a measurement information file for the SEM images; and
converting the design images into a bitmap file format.

6. The method of claim 1, wherein, determining the measurement error of the SEM equipment comprises:

determining, when the alignment coordinate value is out of a set range, that the measurement error is in the SEM equipment; and providing the alignment coordinate value to the SEM equipment as feedback.

7. The method of claim 1, wherein, before extracting the alignment coordinate value, the method further comprises:

determining whether the alignment coordinate value can be extracted; and when the alignment coordinate value cannot be extracted, selecting new training SEM images from among the SEM images for use in repeating of the training.

8. The method of claim 1, wherein the design images comprise Computer-Aided Design (CAD) images and have Graphic Data System (GDS) formats.

9. A method of aligning Scanning Electron Microscopy (SEM) equipment, the method comprising:

acquiring SEM images of a measurement target comprising a device or wiring pattern on a semiconductor substrate by using the SEM equipment;

performing pre-processing on the SEM images and design images of the device or wiring pattern of the semiconductor substrate corresponding thereto;

selecting training SEM images from among the SEM images;

performing training using the training SEM images and training design images corresponding thereto to generate a conversion model between the SEM images and the design images;

converting the SEM images into conversion design images using the conversion model;

extracting an alignment coordinate value by comparing and aligning the conversion design images with the design images corresponding thereto;

determining a measurement error of the SEM equipment based on the alignment coordinate value; and responsive to determining the measurement error in the SEM equipment, transmitting the alignment coordinate value to the SEM equipment and aligning measurement coordinates of the SEM equipment.

10. The method of claim 9, wherein the conversion model is generated using a Generative Adversarial Network (GAN) algorithm.

11. The method of claim 9, wherein extracting the alignment coordinate value comprises:

matching corresponding parts of the design images by moving the conversion design images along an x-axis and/or along a y-axis, wherein the alignment coordinate value is represented by $\Delta x$ and $\Delta y$, corresponding to respective distances along the x-axis and along the y-axis that the conversion design images have moved, and wherein the alignment coordinate value is determined using Peak Signal-to-Noise Ratios (PSNRs) of the conversion design images and the design images.

12. The method of claim 9, wherein, performing the pre-processing comprising:

generating a measurement information file for the SEM images; and converting the SEM images into a bitmap file format.

13. The method of claim 9, wherein, before the extracting of the alignment coordinate value, the method further comprises:

determining whether the alignment coordinate value can be extracted; and when the alignment coordinate value cannot be extracted, selecting new training SEM images from among the SEM images and performing the training using the new training SEM images.

14. The method of claim 9, wherein the design images comprise Computer-Aided Design (CAD) images and have Graphic Data System (GDS) file formats.

15. A method of aligning Scanning Electron Microscopy (SEM) equipment, the method comprising:

acquiring, by a SEM measurement apparatus, SEM images of a measurement target on a semiconductor substrate using the SEM equipment;

performing, by a pre-processor circuit, pre-processing on the SEM images and design images of the device or wiring pattern of the semiconductor substrate corresponding thereto;

selecting training SEM images from among the SEM images;

performing training using the training SEM images and training design images corresponding thereto to generate a conversion model between the SEM images and the design images;

converting the SEM images into conversion design images by using the conversion model;

extracting an alignment coordinate value by comparing and aligning the conversion design images with the design images corresponding thereto; and transmitting the alignment coordinate value to the SEM equipment and aligning measurement coordinates of the SEM equipment, wherein extracting of the alignment coordinate value comprises:

moving the conversion design images along an x-axis and/or along a y-axis to match corresponding parts of the design images, wherein the alignment coordinate value is represented by $\Delta x$ and $\Delta y$, corresponding to respective distances along the x-axis and along the y-axis that the conversion design images have moved, and wherein the alignment coordinate value is determined using Peak Signal-to-Noise Ratios (PSNRs) of the conversion design images and the design images.

16. The method of claim 15, wherein generating the conversion model comprises:

generating the conversion model using a Generative Adversarial Network (GAN) algorithm, wherein the measurement target comprises a device or wiring pattern on the semiconductor substrate.

17. The method of claim 15, wherein, performing the pre-processing comprises:

generating a measurement information file for the SEM images; and converting the design images into a bitmap file format, wherein the design images comprise Computer-Aided Design (CAD) images and have Graphic Data System (GDS) formats.

18. The method of claim 15, wherein, before the extracting of the alignment coordinate value, the method further comprises:

determining whether the alignment coordinate value can be extracted; and when the alignment coordinate value cannot be extracted, selecting new training SEM images from among the SEM images and performing the training using the new training SEM images.

* * * * *